(12) United States Patent
Chen et al.

(10) Patent No.: US 10,999,051 B2
(45) Date of Patent: *May 4, 2021

(54) REFERENCE NOISE COMPENSATION FOR SINGLE-ENDED SIGNALING

(71) Applicant: NVIDIA Corp., Santa Clara, CA (US)

(72) Inventors: Xi Chen, Milpitas, CA (US); Nikola Nedovic, San Jose, CA (US); Carl Thomas Gray, Apex, NC (US); Stephen G Tell, Chapel Hill, NC (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/905,635

(22) Filed: Jun. 18, 2020

(65) Prior Publication Data
US 2021/0083836 A1 Mar. 18, 2021

Related U.S. Application Data

(60) Provisional application No. 62/902,232, filed on Sep. 18, 2019.

(51) Int. Cl.
*H04L 7/00* (2006.01)
*H04B 1/12* (2006.01)
*H04B 1/16* (2006.01)
*H03K 3/037* (2006.01)

(52) U.S. Cl.
CPC ........... *H04L 7/0079* (2013.01); *H03K 3/037* (2013.01); *H04B 1/12* (2013.01); *H04B 1/16* (2013.01); *H04L 7/0016* (2013.01)

(58) Field of Classification Search
CPC ....... H04L 7/0079; H04L 7/0016; H04B 1/12; H04B 1/16; H03K 3/037
See application file for complete search history.

(56) References Cited

U.S. PATENT DOCUMENTS

| | | | |
|---|---|---|---|
| 6,801,584 B1 | 10/2004 | Williams | |
| 7,292,662 B2 | 11/2007 | Gregorius | |
| 9,673,849 B1 | 6/2017 | Paraschou et al. | |
| 10,187,094 B1* | 1/2019 | Nedovic | .................. H04B 1/16 |
| 10,326,625 B1* | 6/2019 | Nedovic | ................. H04L 25/06 |
| 2005/0262373 A1* | 11/2005 | Kim | ........................ H03L 7/085 |
| | | | 713/401 |
| 2006/0233291 A1* | 10/2006 | Garlepp | ................ H04L 7/0276 |
| | | | 375/355 |

(Continued)

OTHER PUBLICATIONS

A. Shokrollahi et al., "A Pin-Efficient 20.83GB/s/wire 0.94pJ/bit Forwarded ClockCNRZ-5-Coded SerDes up to 12mm for MCM Packages in 28nm CMOS," ISSCC, pp. 182-183, Feb. 2016.

(Continued)

*Primary Examiner* — David S Huang
(74) *Attorney, Agent, or Firm* — Rowan TELS LLC (57) ABSTRACT

A receiver circuit includes a clock lane propagating a clock signal. A self-sampled clock applies a delayed version of the clock signal to the clock signal and compensation logic controls an amount of delay of the delayed version of the clock, based on a reference voltage offset (difference) between the receiver and a transmitter. The delayed version of the clock is centered on one unit interval of the clock. An offset correction based on a clock duty cycle error is applied to data receiver front ends.

20 Claims, 12 Drawing Sheets

(56) References Cited

U.S. PATENT DOCUMENTS

2009/0252265 A1  10/2009  Xia et al.
2012/0294401 A1  11/2012  Lin et al.

OTHER PUBLICATIONS

B. Zimmer, et al., "A 0.11 pJ/Op, 0.32-128 TOPS, Scalable Multi-Chip-Module-basedDeep Neural Network Accelerator with Ground-Reference Signaling in 16nm," IEEE Symp.VLSI Circuits, pp. 300-301, Jun. 2019.
J. Poulton, et al., "A 1.17-pj/b, 25-Gb/s/pin Ground-Referenced Single-Ended SerialLink for Off- and On-Package Communication Using a Process- and Temperature-Adaptive Voltage Regulator", IEEE JSSC, vol. 54, No. 1, pp. 43-54, Jan. 2019.
M. Erett, et al., "A 126mW 56Gb/s NRZ Wireline Transceiver for Synchronous Short-Reach Applications in 16nm FinFET," ISSCC, pp. 274-275, Feb. 2018.

* cited by examiner

REFERENCE NOISE COMPENSATION FOR SINGLE-ENDED SIGNALING

CROSS-REFERENCE TO RELATED APPLICATIONS

This application claims priority and benefit of U.S. provisional application Ser. No. 62/902,232, titled "REFERENCE NOISE COMPENSATION FOR SINGLE-ENDED SIGNALING", filed on Sep. 18, 2019, the contents of which are incorporated herein by reference in their entirety.

GOVERNMENT LICENSE RIGHTS

This invention was made with Government support under Agreement HR0011-16-3-0003, awarded by DARPA. The Government has certain rights in the invention.

BACKGROUND

With better energy and area efficiency than differential links, single-ended serial links are an attractive signaling technique in short-reach high-bandwidth I/O applications. One limitation of single-ended links is their sensitivity to environment noise because the accuracy of data recovery at the receiver relies heavily on the correlation of reference voltages at the two ends of the link.

Modern integrated circuits may ramp hundreds of amperes of supply current within tens of nanoseconds. These transient currents may induce local supply voltage and ground noise amplitudes of hundreds of millivolts at tens of megahertz and create large reference voltage offsets between chips on different packages on the same printed circuit board. Traditional methods to solve the reference voltage matching problem include using differential signaling and data pattern coding. These methods require relatively large power and pin overhead compared to single-ended solutions.

Single-ended signaling utilizes a reference signal to correlate the thresholds at both transmit (TX) and receive (RX) ends of the link. This reference signal may be communicated through a dedicated channel or embedded (coded) with the data signals. Both methods sacrifice bandwidth and/or can be expensive to implement.

For short-range (e.g., on-package) links between different chips where a reliable common reference (e.g., ground plane) is available, the chip-to-chip reference offset is often low enough relative to the signal amplitude that it fits within a performance margin. However in longer-range links (e.g., package-to-package), low-frequency noise caused by local load current changes paired with power distribution network (PDN) resonances may induce a reference offset between the transmitter and the receiver that significantly consumes or exceeds the performance margin.

BRIEF DESCRIPTION OF THE SEVERAL VIEWS OF THE DRAWINGS

To easily identify the discussion of any particular element or act, in most cases the most significant digit or digits in a reference number refer to the figure number in which that element is first introduced.

DETAILED DESCRIPTION

Disclosed herein are embodiments of a self-sampled clock to extract reference voltage imbalance information from a received clock signal on single-ended links. The reference voltage imbalance is compensated for at a tunable receiver front-end. The clock signal is sampled at a half-rate (e.g., equivalent to a "1010" . . . sampling pattern) and therefore the reference voltage error between the transmitter and the receiver is encoded in the clock duty cycle. The clock duty cycle is detected by self-sampling the clock with a version of itself centered around 1 (one) unit interval (UI) delay. "Unit interval" refers to the minimum time interval between condition changes of a data transmission signal, also known as the pulse time or symbol duration time. For a clock signal the unit interval is the interval between the rising and falling edges of the clock pulse. This results in a sampled "1" for duty cycles above 50% and a sampled "0" for duty cycles below 50%. A sampled "1" is interpreted as a positive transmitter-to-receiver reference voltage offset (error). A sampled "0" is interpreted as a negative transmitter-to-receiver reference voltage offset.

The disclosed solutions utilize duty-cycle compensation logic to tune the receiver front-end offset to drive the clock duty cycle to 50%, thereby tracking the reference noise and closing the control loop. During initialization of the link, the data path delay in the forwarded clock lane may be trimmed to match the delay of receiver (RX) clock buffers. The compensation logic also includes a loop, for example a delay-locked-loop (DLL), formed from the clock lane sampler, de-serializer, and delay tuning logic to dynamically adjust the delay of the 1UI delay block to compensate for environment changes. The accuracy of the offset compensation is eventually limited by loop latency and offset tuning step size.

The phase sense error for the delay-locked-loop may be determined by comparing even and odd samples of the same de-serialized clock signal as the offset compensation loop. Programmable sensing thresholds may be configured to control the open loop gain of both offset and delay compensation loops and to tolerate uncalibrated errors or interference. Voltage regulation and initial calibration may be applied to set a default value of the one-UI delay. Small residual errors of the one-UI delay do not affect the offset compensation loop provided that the threshold margin is large enough. Rapid environment changes such as supply voltage noise may induce higher delay errors and may temporarily increase the dead zone in the offset compensation loop transfer function. The delay tuning logic detects such conditions and adjusts the delay of 1-UI delay block back to within its acceptable range.

The digital circuitry of the compensation loops and any adjacent logic is driven at the parallel clock frequency (herein, PCLK). Signal routing and digital processing latencies may limit the compensation loops response time. A programmable setting is utilized to slow down the output of tuning signals by one or more periods of PCLK. This feature improves the noise tracking accuracy and minimizes the jitter in both offset and delay compensation loops with some impact to overall bandwidth. Counters may be employed with the delay-locked-loop and offset compensation loop to adjust tuning codes by one or more steps each cycle.

The disclosed mechanisms utilize a tunable one-UI delay circuit. The one-UI delay circuit provides 1) monotonic tuning, 2) fine resolution that matches the offset tuning, and 3) a range sufficient for environment factors such as supply noise. The system is designed for linear behavior by distributing each bit to all delay stages. Process variations of the one-UI delay circuit may be compensated for by tuning the clock lane data-path delay. In the compensation loops the sampler operates as a single bit quantizer, which may cause unfavorably high gain under low-noise conditions. To avoid overshooting in the dynamic response of the offset compensation loop, clock dithering may be applied to linearize the noise transfer function by toggling the delay control for one or more least significant bits in each parallel clock cycle. "Dithering" refers to the deliberate introduction of noise to alter predictable behavior of a signal.

Figure 1:
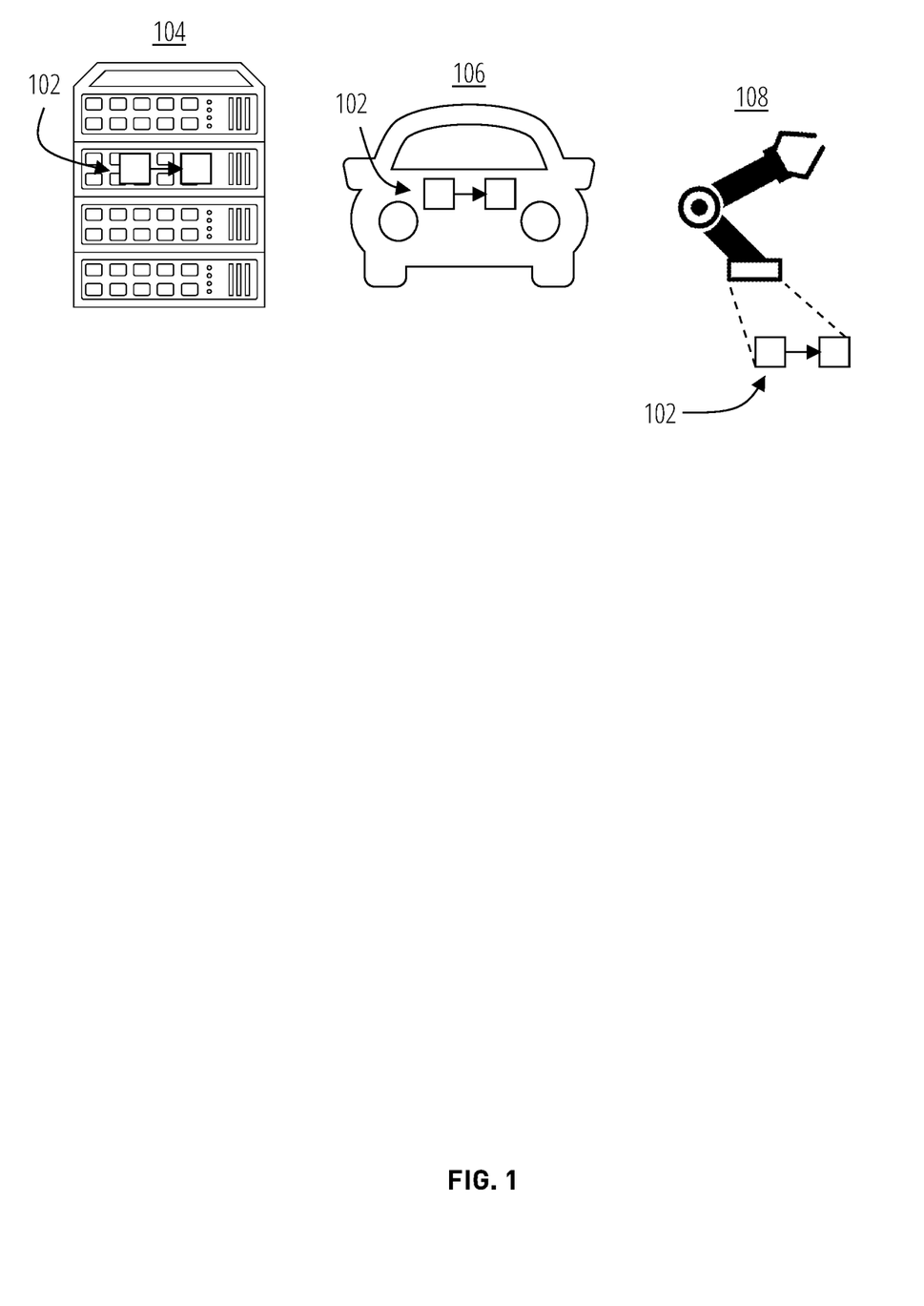
FIG. 1 depicts a transmitter-receiver system 102 in accordance with one embodiment.

FIG. 1 depicts exemplary scenarios for use of a transmitter-receiver system 102 in accordance with some embodiments. A transmitter-receiver system 102 may be utilized in a computing system 104, a vehicle 106, and a robot 108, to name just a few examples.

Figure 2:
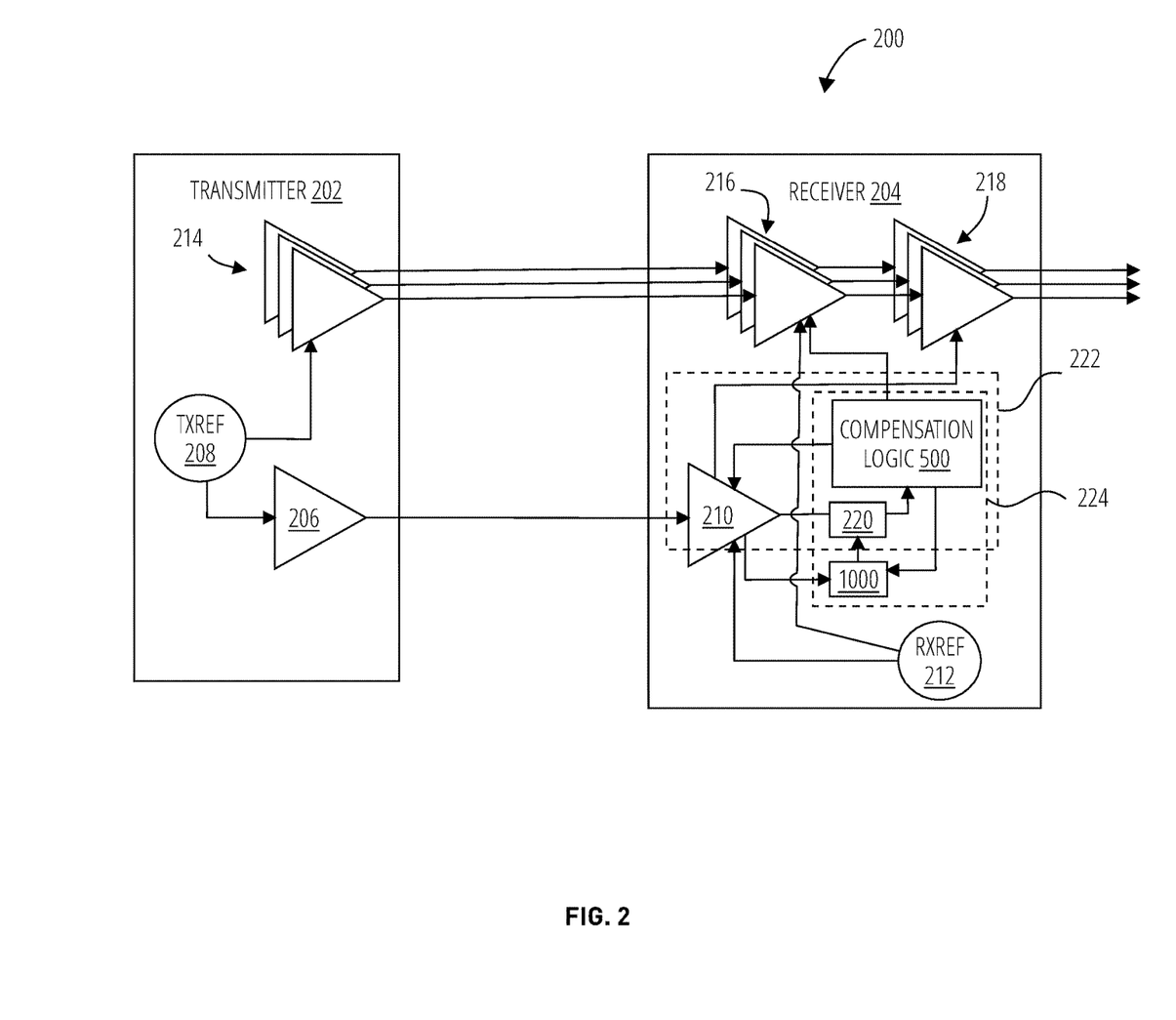
FIG. 2 depicts a single ended transceiver 200 in one embodiment.

FIG. 2 depicts an embodiment of a single ended transceiver 200. At a high level, the single ended transceiver 200 comprises a transmitter 202 and a receiver 204. The transmitter data lane drivers 214 of the transmitter 202 communicate data to the receiver 204 over a plurality of serial data links. The transmitter clock lane driver 206 of the transmitter 202 communicates a clock signal to the receiver 204 over a serial clock link. The receiver 204 applies the received clock signal to extract the data from the serial data links. The transmitter data lane drivers 214 and transmitter clock lane driver 206 utilize a transmitter reference voltage 208, and the receiver 204 circuits utilize a receiver reference voltage 212. The transmitter reference voltage 208 and the receiver reference voltage 212 may become offset from one another due to power supply or ground transients and other factors such as environmental noise and process-voltage-temperature (PVT) variations.

The receiver 204 comprises a receiver clock front end 210, receiver clock sampler 220, receiver data front ends 216, receiver data samplers 218, and compensation logic 500. The receiver clock front end 210, receiver clock sampler 220, and compensation logic 500 form a reference voltage offset compensation loop 222 (a clock sampling delay circuit 1000, depicted later, is also part of this loop). The receiver clock sampler 220, clock sampling delay circuit 1000, and compensation logic 500 form a delay compensation loop 224.

In feed-forward clocking systems such as the single ended transceiver 200, the reference voltage offset of single-ended links may thus be determined from the clock signal, because the clock pattern is single-tone and (ideally) DC-balanced.

By monitoring the clock lane signal the reference voltage offset may be calculated and compensated for at the receiver 204. This effectively extends the range of single-ended links. More generally it enables communications over greater lengths, noisier environments (such as links within multichip modules with strong current transients), or both.

Figure 3:
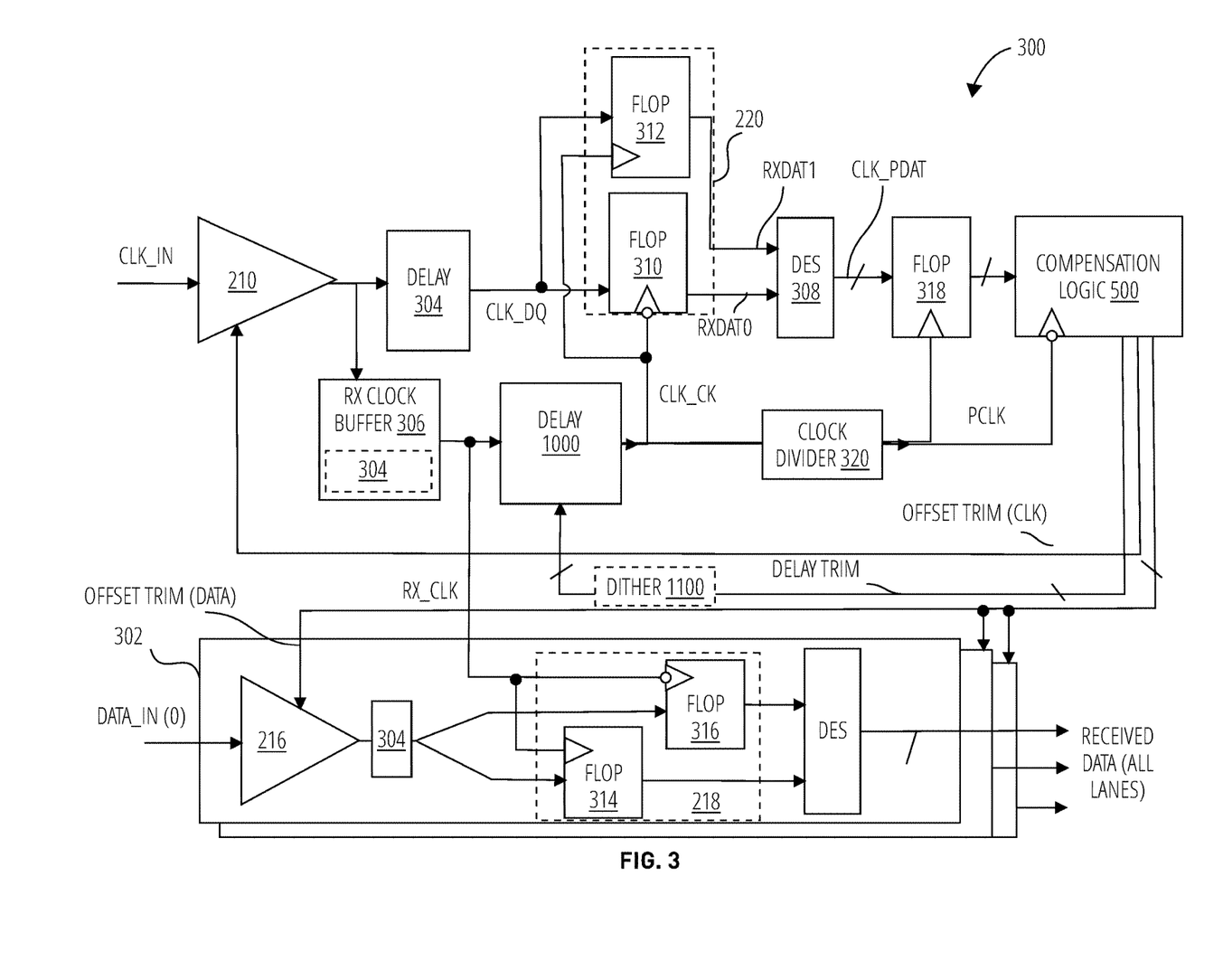
FIG. 3 depicts a self-sampling receiver clock 300 in accordance with one embodiment.

FIG. 3 depicts a self-sampling receiver clock 300 in one embodiment. The clock signal from the transmitter 202 (CLK_IN) is received at the receiver clock front end 210 and sharpened. An amplified and delayed version of CLK_IN matching the data sampling clock, labelled CLK_DQ, is then forwarded to the receiver clock sampler 220 which in the depicted embodiment comprises flop 312 and flop 310. A delay 304 to the received clock signal is incurred between the receiver clock front end 210 and the receiver clock sampler 220. This delay 304 may be tuned, e.g., at power-up of the self-sampling receiver clock 300, to match the delay 304 of the RX clock buffer 306 between the receiver clock front end 210 and the receiver data sampler 218, which in the depicted embodiment comprises flop 316 and flop 314. Only a single data line receiver stage 302 is depicted, although it will be understood that there will typically be one data line receiver stage for each data line between the transmitter 202 and the receiver 204, each receiving RX_CLK and OFFSET_TRIM.

The receiver clock sampler 220 samples CLK_DQ at times triggered by the signal CLK_CK from the clock sampling delay circuit 1000. The odd and even clock samples (labelled RXDAT1 and RXDAT0) from receiver clock sampler 220 are applied to the clock de-serializer 308, which collects a number of clock samples into a vector CLK_PDAT or other parallel structure (e.g., a 16 bit word). This vector may include equal numbers of odd and even samples of the sampled clock signal (e.g., 8 odd samples and 8 even samples). A clock divider 320 is provided so that the output of the clock de-serializer 308 is only sampled after every full vector of clock samples is formed. For example, if the clock de-serializer 308 collects 8 odd samples and 8 even samples to form a 16 bit word, the clock divider would only trigger the flop 318 to sample the clock de-serializer 308 output every 8 cycles of CLK_CK, where a cycle comprises one rising edge and one falling edge of CLK_CK.

The vector output of the flop 318 is input to the compensation logic 500, which is part of both the delay compensation loop 224 and the offset compensation loop 222. The delay compensation loop 224 adjusts the delay of the sampling trigger to the receiver clock sampler 220 by an amount centered around a 1UI delay value. The amount of delay applied to trigger the receiver clock sampler 220 is determined as 1UI±the DELAY_TRIM from the compensation logic 500. The offset compensation loop 222 adjusts the receiver clock front end 210 and the receiver data front end 216 to account for the offset between the transmitter reference voltage 208 and the receiver reference voltage 212.

An optional dithering generator 1100 may be applied to DELAY_TRIM to better linearize the closed loop behavior of the delay compensation loop 224.

The self-sampling receiver clock 300 detects the average value of the received clock signal CLK_IN by sampling CLK_DQ by a delayed version of itself. When the inserted delay is about 1UI (one unit interval), the self-sampling process operates similar to a one-tap low-pass comb filter. The clock sampling delay circuit 1000 may be configured to have a central setting around 1UI. The clock sampling delay circuit 1000 is inserted between RX_CLK (the sampler clock for all data lanes) and CLK_CK (the sampler clock for CLK_DQ).

The value of delay 304 between the receiver clock front end 210 and the receiver clock sampler 220 may be configured so that the sampled clock signal matches the sampler clock for the data lanes. The compensation logic 500 monitors the sample vector output by the clock de-serializer 308 and adjusts the receiver clock front end 210 offset trim to balance the number of "1" and "0" samples in the vector. For example, when there is substantial positive error due to an offset between the transmitter reference voltage 208 and the receiver reference voltage 212, all samples of RXDAT0 and RXDAT1, and therefore all values in the clock de-serializer 308 output vector, will be "1". In this case the compensation logic 500 adjusts OFFSET_TRIM downward. The compensation logic 500 adjusts OFFSET_TRIM upward if a negative error is detected as indicated by all "0" values in the clock de-serializer 308 output vector. Because the flop 318 samples the clock de-serializer 308 output vector at a fraction of the full clock rate (e.g., ⅛th of the forwarded clock (CLK_IN) rate), the highest available update rate for OFFSET_TRIM is also this fraction (e.g., ⅛th) of the forwarded clock rate.

Figure 4:
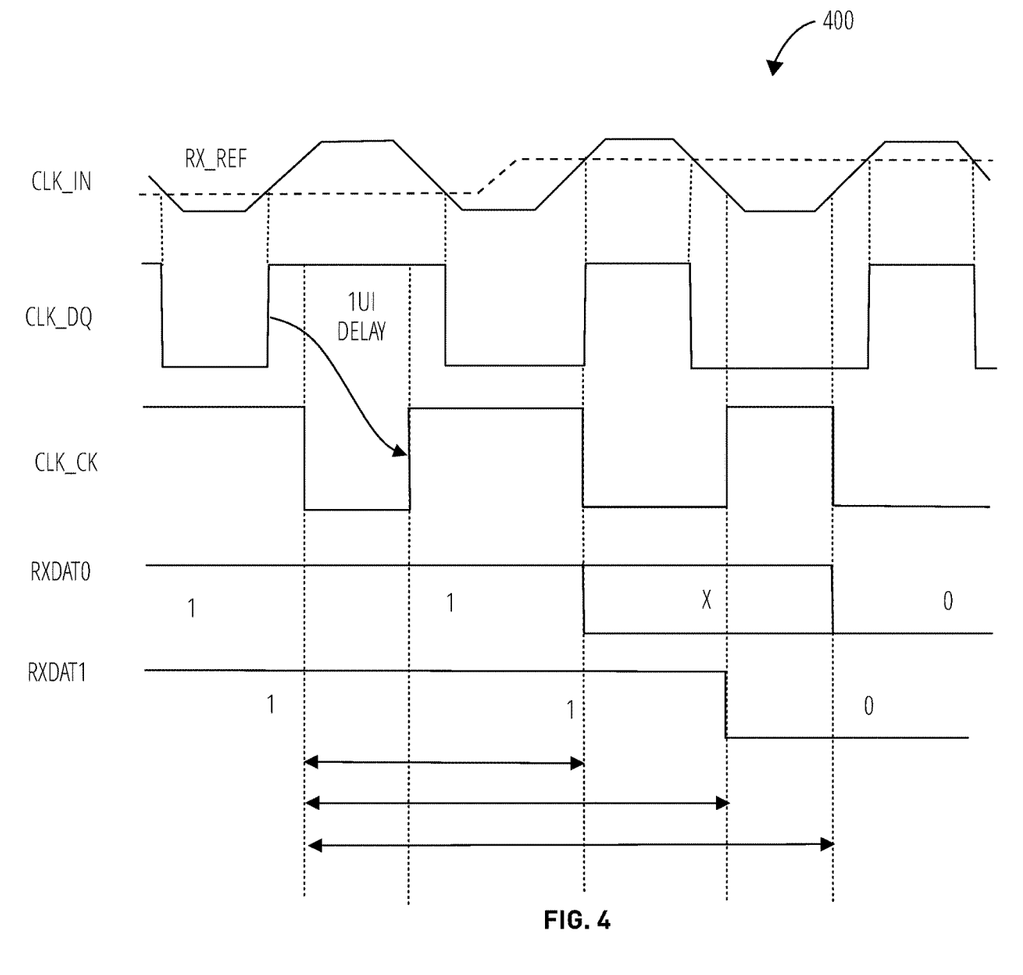
FIG. 4 depicts exemplary signal timing diagrams 400 for the self-sampling receiver clock 300.

FIG. 4 depicts exemplary signal timing diagrams 400 for signals in the self-sampling receiver clock 300 including CLK_IN, CLK_DQ, CLK_CLK, RXDAT0, and RXDAT1.

Figure 5:
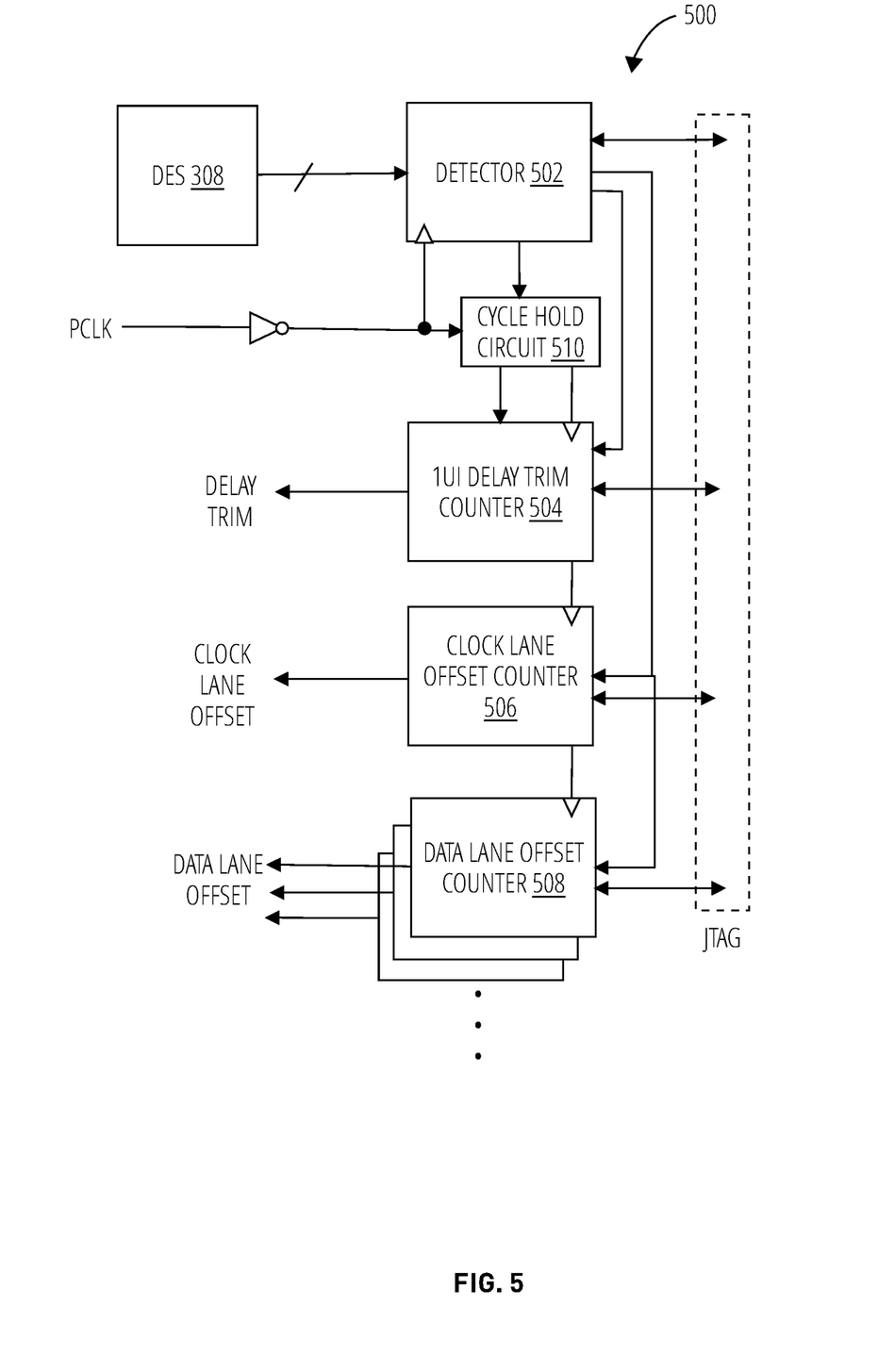
FIG. 5 depicts compensation logic 500 for controlling the clock sampling delay circuit 1000 and data receiver front end, in accordance with one embodiment.

FIG. 5 depicts an embodiment of compensation logic 500 that may be utilized in embodiments such as the self-sampling receiver clock 300. The compensation logic 500 comprises a detector 502, a 1UI delay trim counter 504, a clock lane offset counter 506, one or more data lane offset counter 508, and a cycle hold circuit 510.

The detector 502 receives the clock sample vector from the clock de-serializer 308 and generates up or down control signals to the 1UI delay trim counter 504, clock lane offset counter 506, and each of the data lane offset counters 508.

The cycle hold circuit 510 may be used in order to control the output rates of the 1UI delay trim counter 504, clock lane offset counter 506, and data lane offset counters 508 independently of the PCLK rate that drives the detector 502. The detector 502 executes at PCLK, but when the latency of either the offset compensation loop 222 or the delay compensation loop 224 is of the order of multiple PCLK cycles, unconditional loop stability is not guaranteed anymore. This may be due to the calculated adjustments becoming outdated by the time they reach their destinations (clock sampling delay circuit 1000, receiver clock front end 210, or receiver data front end 216), resulting in oscillation instead of settling to the right value. The bandwidth of the compensation logic 500 may be effectively reduced by updating the control settings at a lower rate. The cycle hold circuit 510 determines how many extra PCLK cycles the compensation logic 500 should hold before sending the new control signals out. A larger control signal cycle limit improves the compensation loops' stability at the cost of lower bandwidth.

Figure 6:
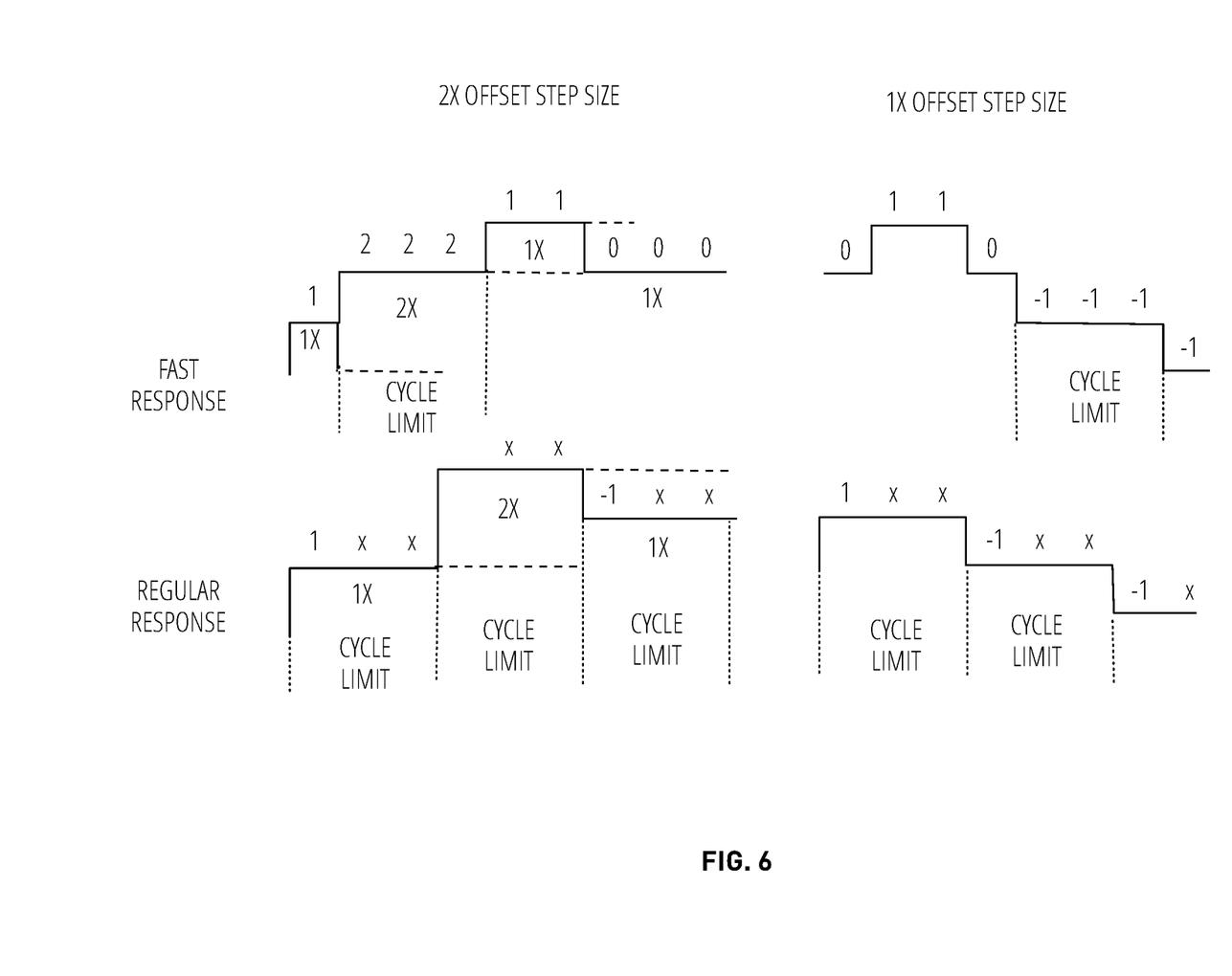
FIG. 6 depicts exemplary signal diagrams for loop response.

Another configuration option is dynamic reconfiguration of the response speed. FIG. 6 depicts exemplary signal diagrams for loop response. The fast response configuration may be configured to compensate relatively high reference noise frequency (e.g. >20 MHz). In a fast response configuration, when new error information (different from the previous cycle) arrives the control settings update on the next PCLK cycle and the cycle limit counter is reset. Fast response may sacrifice some stability for higher compensation bandwidth and is useful if both the reference noise frequency and its amplitude are high, making the stability of less concern due to the lowered loop gain from saturation of the compensation slew rate.

Yet another configuration option is setting the offset trim step size. The maximum noise frequency and/or amplitude that the offset compensation loop 222 tracks depends on the slew rate, which equals to voltage/bit*bits/cycle*cycles/second. The voltage/bit value is determined by the amplifier design used in the receiver front end, and the cycles/second is constrained by both the link data rate and stability requirements. If the receiver clock sampler 220 implements multi-bit quantization, the control bit step size may be increased accordingly, as can the bits/cycle and compensation slew rate. Some example cases are depicted in the tables below.

| OFFSET Step X2 | | | | | |
|---|---|---|---|---|---|
| Pdat<>sum | 0 | (0, 4] | (4, 12) | [12, 16) | 16 |
| Vsum | −2 | −1 | 0 | 1 | 2 |

| OFFSET Step X1 | | | |
|---|---|---|---|
| Pdat<> sum | 0 | (0, 16) | 1 |
| Vsum | −1 | 0 | 1 |

An optimization is to apply the falling clock edge of PCLK to drive the compensation logic 500. For longer distance communications, both input and output flops are typically utilized to compensate for the timing variations of routings. A whole PCLK cycle may be too large for a few hundred pico-second wire delay. The wire delay of the PCLK distribution may create a time-borrowing effect and relax the timing challenges. Applying the falling edge of the clock in the compensation logic 500 may decrease the total latency by half a PCLK cycle.

Figure 7:
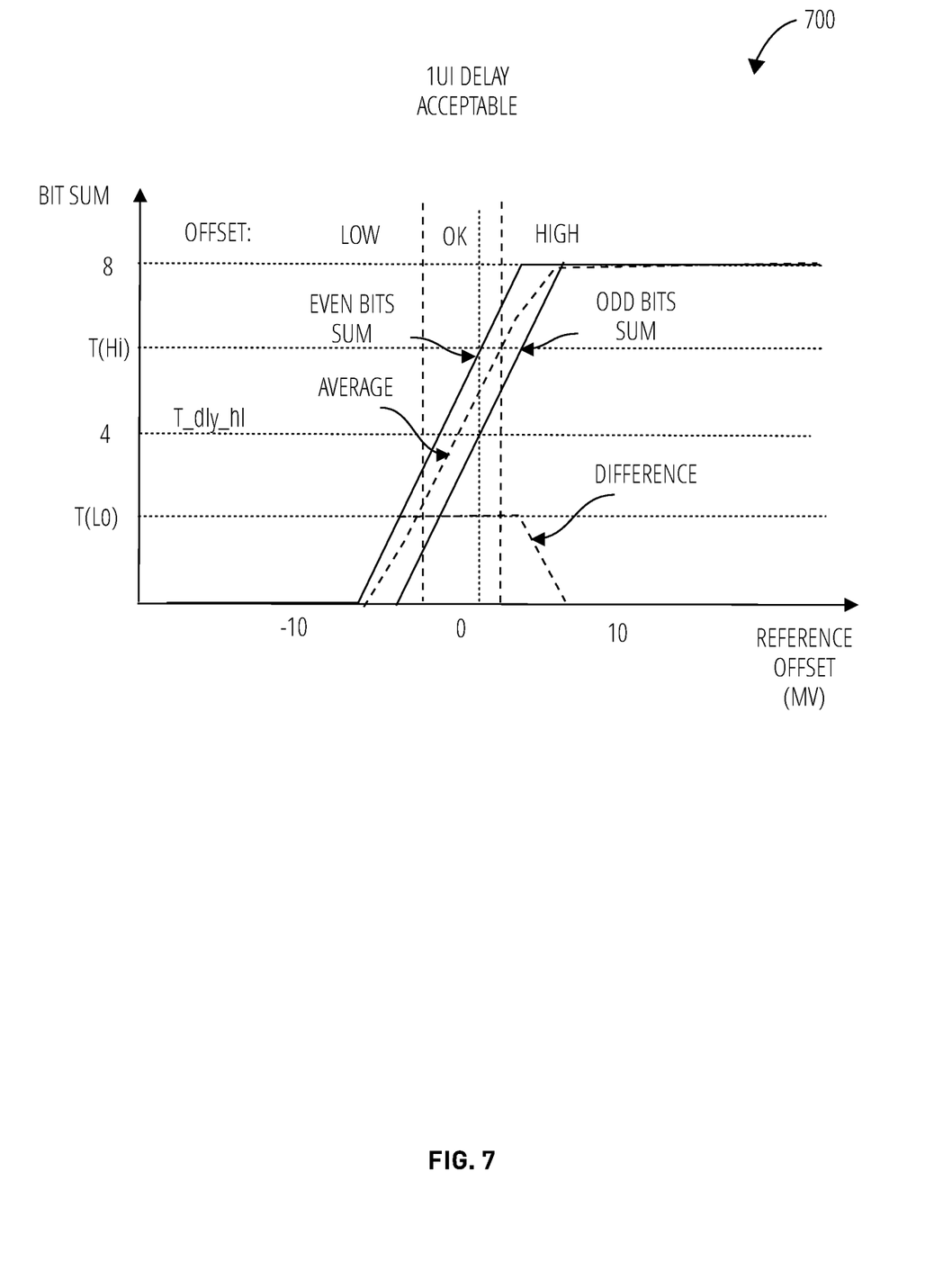
FIG. 7 depicts acceptable 1UI delay conditions 700 in accordance with one embodiment.
Figure 8:
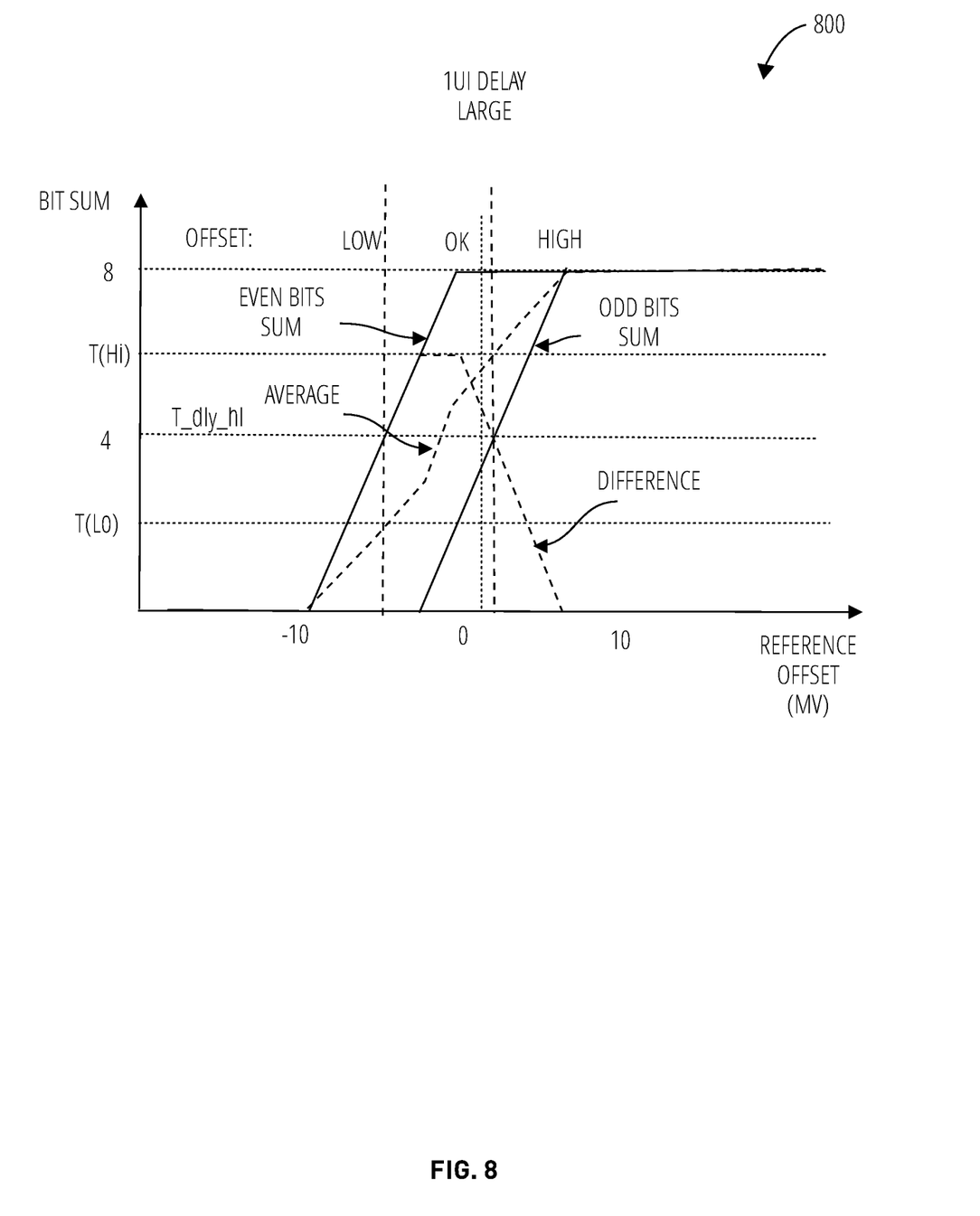
FIG. 8 depicts large 1UI delay conditions 800 in accordance with one embodiment.

In practice the clock sampling delay circuit 1000 may be affected by process-voltage-temperature (PVT) variations. If the delay shift is slow enough, dynamic tuning of the delay 304 may be utilized to compensate for such variations. The clock sampling delay circuit 1000 itself may have a large enough tuning range to compensate for the relatively fast (relative to the delay shift) environmental changes (e.g. power supply noise). The detector 502 may implement delay error detection by comparing the even-bits-sum and the odd-bits-sum of the CLK_PDAT sample vector output by the clock de-serializer 308. By configuring appropriate threshold values for the delay and offset error detections, both of the offset compensation loop 222 and delay compensation loop 224 may be implemented as bang-bang control loops based on the CLK_PDAT clock de-serializer 308 output. The acceptable 1UI delay conditions 700 of FIG. 7 and the large 1UI delay conditions 800 of FIG. 8, and Table 1 and Table 2 below, depict examples of delay error detection and threshold definition that may be utilized by the detector 502, assuming 1-to-16 clock de-serializer 308 is utilized.

TABLE 1

1UI error detection and adjustment

| Even + Odd Bit Sum | 1UI Delay Adjustment |
|---|---|
| ≥2$T_{hi}$ | trim down |
| ≤$T_{lo}$ | trim up |
| other | no change |

TABLE 2 offset error detection and adjustment

| Even − Odd Bit Sum | Offset Adjustment |
|---|---|
| >$T_{dly\_hl}$ | decrease offset |
| <−$T_{dly\_hl}$ | increase offset |
| other | no change |

The thresholds may be made tunable to provide more flexibility for optimization. In both the offset compensation loop 222 and the delay compensation loop 224, the clock de-serializer 308 operates as a low-pass filter and limits the maximum bandwidth of the loops. In practice, the bandwidth of both loops is most likely to be constrained by digital circuit latency (e.g., latency of the compensation logic 500). The self-sampling of the clock may function even when the clock sampling delay circuit 1000 delay is inaccurate. An error in the clock sampling delay circuit 1000 delay results in a dead zone in the offset compensation loop 222 transfer function. The trim step size for the clock sampling delay circuit 1000 should be set low enough to match the offset adjustment resolution.

One manner of defining the thresholds for delay compensation loop 224 and offset compensation loop 222 error detection is using set (unvarying) maximum and minimum values, such as 8 and 0, which can be efficiently implemented with logic gates. However, for better environmental noise tolerance and design flexibility, error detection thresholds may be made configurable (e.g., programmable).

Figure 9:
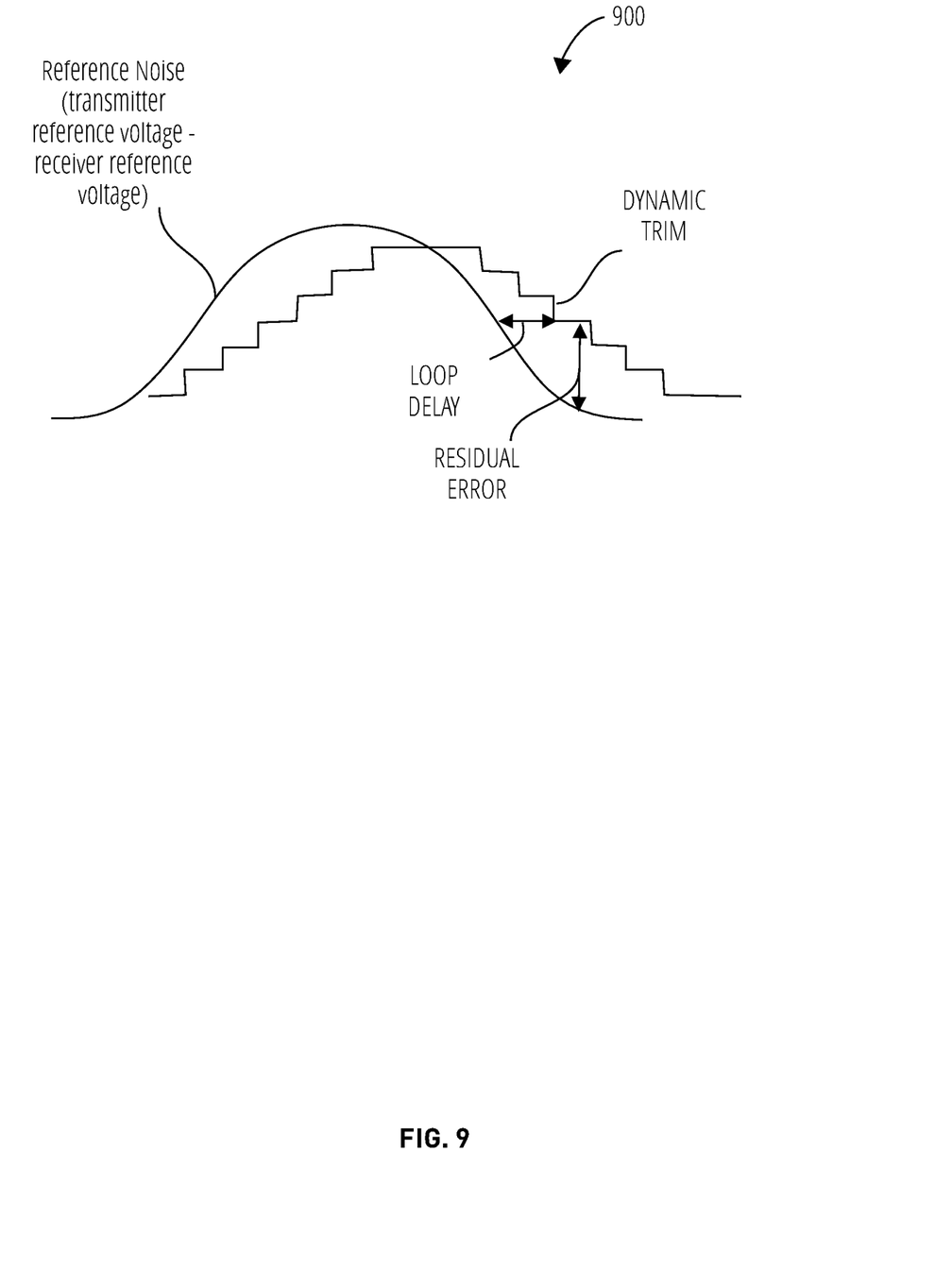
FIG. 9 depicts dynamic offset compensation 900 in accordance with one embodiment.

The dynamic offset compensation 900 example depicted in FIG. 9 represents ideal transient performance of the offset compensation loop 222. The maximum speed of the offset compensation loop 222 is limited by the slew-rate when only single-bit quantization and counter logic are utilized. The frequency range of the dynamic offset compensation 900 will be larger for lower amplitudes, and vice versa. A lower offset tuning step may provide lower DC residue error but will reduce the slew rate and bandwidth of AC offset compensation. The residue error of AC offset compensation is primarily caused by the latency of the offset compensation loop 222 and the offset compensation step size. In practice extra clock cycles spent on digital processing and communications may reduce the maximum bandwidth of the reference noise offset compensation loop 222.

Figure 10:
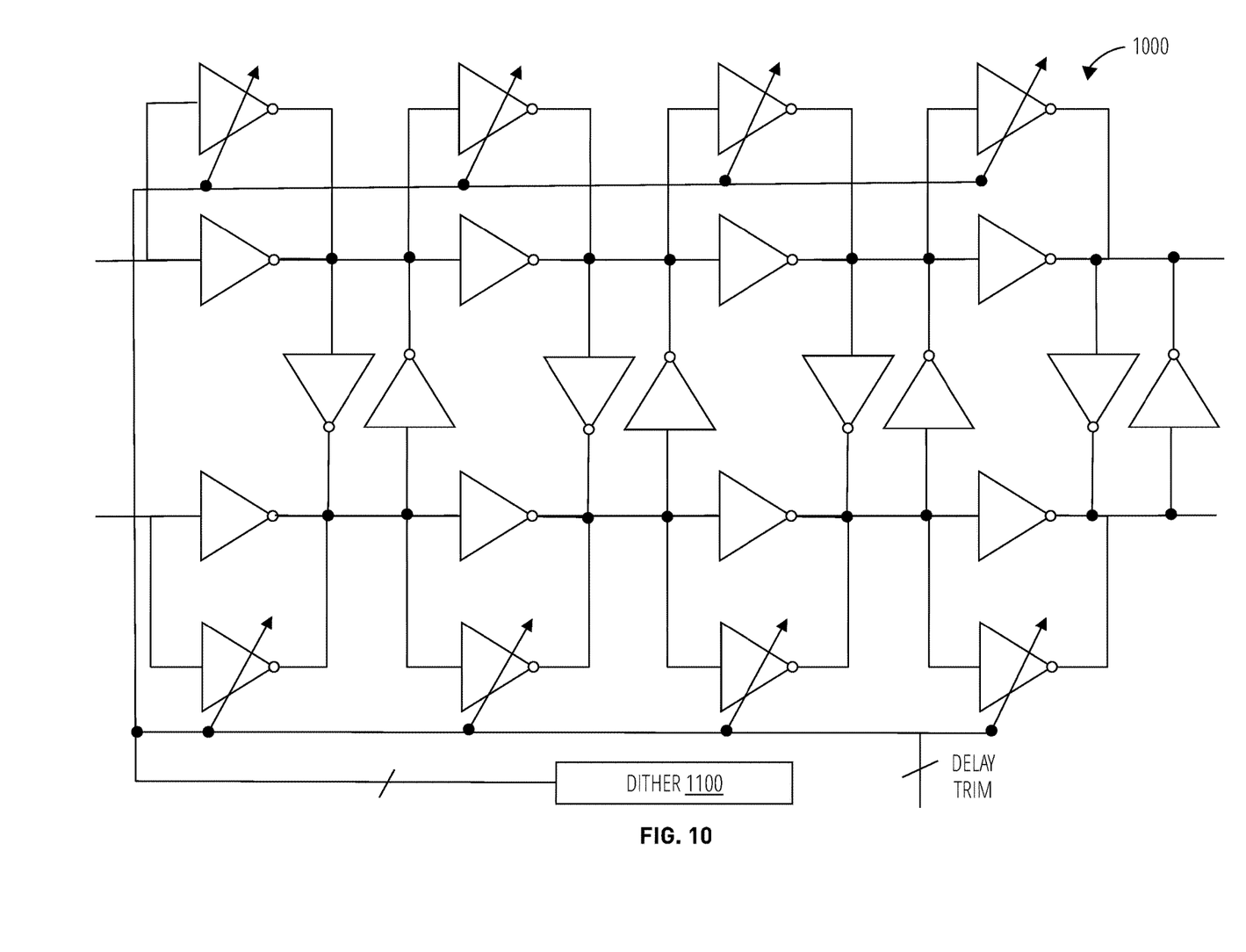
FIG. 10 depicts a clock sampling delay circuit 1000 in accordance with one embodiment.
Figure 11:
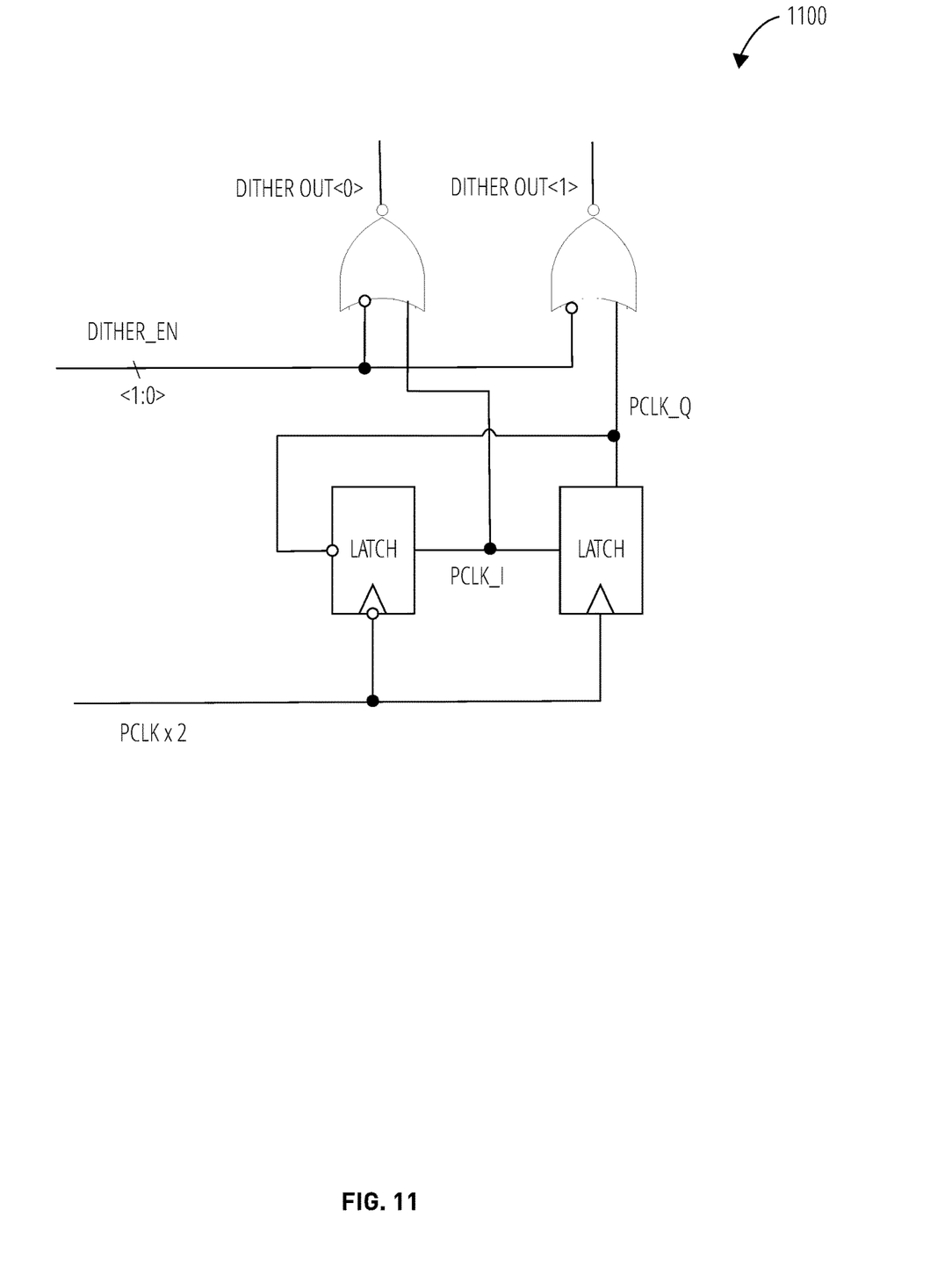
FIG. 11 depicts a dithering generator 1100 in accordance with one embodiment.

FIG. 10 depicts an embodiment of the clock sampling delay circuit 1000, with the optional influence of the dithering generator 1100. In the offset compensation loop 222 and delay compensation loop 224 the receiver clock sampler 220 operates as a single bit quantizer that may provide unfavorable infinite gain under certain conditions. This could result in instability. One technique for mitigating this possibility is to employ clock dithering to create a small dead-zone for the receiver clock sampler 220. For example the DELAY TRIM binary code applied to the clock sampling delay circuit 1000 may be toggled by a few least significant bit (LSB) values during each PCLK cycle. In some embodiments a gray-code (e.g., 2-bit DITHER_EN) may be injected into DELAY TRIM to provide more deterministic linearity for the receiver clock sampler 220 effective gain, enabling multi-bit quantization and higher-order filtering for greater compensation bandwidth. Multi-bit sweeping techniques may be utilized to dither the clock sampling for more deterministic linearity. An exemplary embodiment of the dithering generator 1100 is depicted in FIG. 11.

Figure 12:
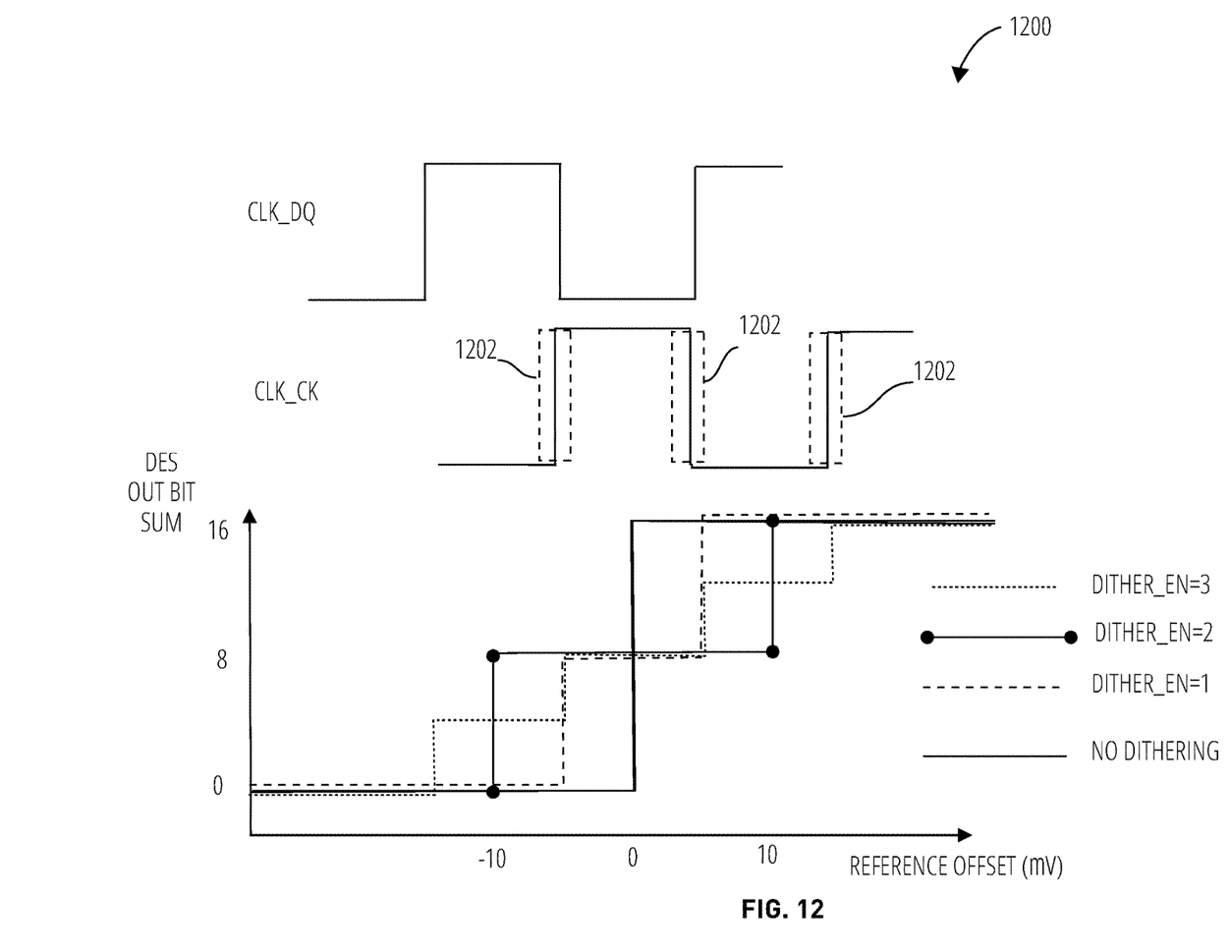
FIG. 12 depicts a signal diagrams 1200 in accordance with one embodiment.

FIG. 12 depicts signal diagrams 1200 including CLK_DQ, a corresponding CLK_CLK signal with dithered edges 1202, and the relationship of the clock de-serializer 308 bit sum to the reference voltage offset for different values of DITHER_EN. Table 3 below shows exemplary signal values for the dithering generator 1100.

TABLE 3 dithering codes and outputs

| Dither EN | | Dither Out | |
|---|---|---|---|
| <1> | <0> | <1> | <0> |
| 0 | 0 | 0 | 0 |
| 0 | 1 | 0 | PCLK_I |
| 1 | 0 | PCLK_Q | 0 |
| 1 | 1 | PCLK_Q | PCLK_I |

Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A circuit comprising:
   a tunable receiver for a data signal;
   a clock signal input;
   a sampling circuit configured to generate a sample of a clock signal received at the clock signal input using a one unit interval delayed version of the clock signal; and
   a compensation circuit to generate an offset signal from the sample of the clock signal and to apply the offset signal to the tunable receiver for the data signal.

2. The signal receiver circuit of claim 1, further wherein the offset compensates for a reference voltage error of the clock signal input.

3. The signal receiver circuit of claim 2, wherein:
   the sampling circuit is configured to sample the clock signal at a half-rate; and
   the offset generated by the compensation circuit is based on the reference voltage error.

4. The signal receiver circuit of claim 2, wherein:
   the sampling circuit is configured to interpret a sampled "1" as a positive reference voltage error; and
   the sampling circuit is configured to interpret a sampled "0" as a negative reference voltage error.

5. The signal receiver circuit of claim 1, the compensation circuit comprising a configurable step size for an offset compensation loop coupled to the clock signal input.

6. A receiver circuit coupled to receive a clock signal from a transmitter circuit, the receiver circuit comprising:
   a clock sampler coupled to a clock lane configured to propagate a clock signal;
   a data lane receiver;
   the clock sampler configured to apply a delayed version of the clock signal to the clock signal to generate a self-sampled clock signal;
   compensation logic to determine a reference voltage error between the receiver circuit and the transmitter circuit based on the self-sampled clock signal; and
   logic to apply an offset voltage to the data lane receiver, the offset voltage applied to the data lane receiver based on the reference voltage error.

7. The receiver circuit of claim 6 configured to center the delayed version of the clock signal on one unit interval of the clock signal.

8. The receiver circuit of claim 6 configured to apply an offset voltage to the clock lane, the offset voltage applied to the clock lane based on the reference voltage error.

9. The receiver circuit of claim 8, wherein the compensation logic comprises a configurable offset voltage adjustment step size.

10. The receiver circuit of claim 6 wherein the compensation logic is configured to apply a trim to the delayed version of the clock signal.

11. The receiver circuit of claim 10, wherein the trim is based on environmental conditions of the receiver circuit.

12. The receiver circuit of claim 10, the compensation logic configured to control an amount of the trim based on a number of sampled "1"s and "0"s sampled in the clock signal.

13. The receiver circuit of claim 6, the compensation logic configured to receive a de-serialized clock signal formed from the clock signal.

14. The receiver circuit of claim 6, further comprising a configurable delay at an input of the clock sampler.

15. The receiver circuit of claim 6, further comprising a dithering circuit configured to affect a sample interval of the clock sampler.

16. A method in a digital receiver, the method comprising:
    receiving a clock signal;
    applying the clock signal to a data receiver;
    sampling the clock signal with a delayed version of the clock signal centered on one unit interval of the clock signal to generate a count; and
    adjusting an offset voltage of the data receiver based on the count.

17. The method of claim 16, wherein the clock signal is sampled at a half-rate.

18. The method of claim 16, wherein the count comprises a combination of sampled even bits and sampled odd bits of the clock signal.

19. The method of claim 18, wherein the combination is a sum.

20. The method of claim 18, wherein the delay of sampling the clock signal is dithered.

* * * * *